United States Patent
Uchida

(10) Patent No.: US 11,428,712 B2
(45) Date of Patent: Aug. 30, 2022

(54) ANALYSIS DEVICE AND IMAGE GENERATION METHOD

(71) Applicant: Tokyo Electron Limited, Tokyo (JP)

(72) Inventor: Shin Uchida, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/312,203

(22) PCT Filed: Nov. 28, 2019

(86) PCT No.: PCT/JP2019/046565
§ 371 (c)(1),
(2) Date: Jun. 9, 2021

(87) PCT Pub. No.: WO2020/121825
PCT Pub. Date: Jun. 18, 2020

(65) Prior Publication Data
US 2022/0026465 A1    Jan. 27, 2022

(30) Foreign Application Priority Data

Dec. 10, 2018   (JP) .............................. JP2018-230769

(51) Int. Cl.
*G01R 1/067* (2006.01)
*G01R 1/02* (2006.01)
*G01R 31/28* (2006.01)

(52) U.S. Cl.
CPC ........... *G01R 1/0675* (2013.01); *G01R 1/025* (2013.01); *G01R 31/28* (2013.01)

(58) Field of Classification Search
CPC ....... G01R 1/0675; G01R 1/025; G01R 31/28
See application file for complete search history.

(56) References Cited

FOREIGN PATENT DOCUMENTS

JP           2005-045194 A       2/2005

*Primary Examiner* — Alesa Allgood
(74) *Attorney, Agent, or Firm* — Nath, Goldberg & Meyer; Jerald L. Meyer; Tanya E. Harkins

(57) ABSTRACT

An analysis device analyzes inspection results of an inspection object which includes inspection target devices having respective electrodes on which needle marks are formed. The analysis device includes a display part for displaying an image, and an image generation part for generating an image to be displayed on the display part. The image generation part generates an analysis image based on information on inspection results with respect to the needle marks. The analysis image includes a needle mark scatter plot image showing positions of the needle marks with respect to the electrodes in each inspection target device in an overlapped manner, an inspection object map image showing a surface of the inspection object and showing needle mark inspection results with respect to the inspection target devices, and a captured image of the electrodes. Display contents of the images are linked with each other.

9 Claims, 10 Drawing Sheets

ANALYSIS DEVICE AND IMAGE GENERATION METHOD

This is a National Phase Application filed under 35 U.S.C. 371 as a national stage of PCT/JP2019/046565, filed Nov. 28, 2019, an application claiming the benefit of Japanese Application No. JP 2018-230769, filed Dec. 10, 2018, the content of each of which is hereby incorporated by reference in its entirety.

TECHNICAL FIELD

The present disclosure relates to an analysis device and an image generation method.

BACKGROUND

Patent document 1 discloses a needle mark reading device for reading a needle mark formed on an electrode pad when electrical characteristics of an inspection object including the electrode pad are inspected. This needle mark reading device includes a capturing means configured to capture an image of an electrode pad and output the image obtained by the capturing, a storage means configured to store the image received from the capturing means, and a needle mark inspection means configured to determine the quality of a needle mark included in the image based on the image stored in the storage means.

PRIOR ART DOCUMENTS

Patent Documents

Patent Document 1: Japanese Laid-Open Patent Publication No. 2005-045194

SUMMARY

A technique according to the present disclosure makes it easy to perform a detailed analysis based on a needle mark formed on an electrode formed on an inspection object.

An aspect of the present disclosure relates to an analysis device for analyzing results of inspection of an inspection object. The inspection object includes a plurality of inspection target devices formed thereon and having respective electrodes on which needle marks are formed by being brought into contact with probes during an electrical inspection. The analysis device includes a display part configured to display an image, and an image generation part configured to generate an image to be displayed on the display part. The image generation part is configured to generate an analysis image based on information pertaining to inspection results with respect to the needle marks. The analysis image includes a needle mark scatter plot image showing positions of the needle marks with respect to the electrodes in each of the plurality of inspection target devices in an overlapped manner, an inspection object map image which is an image showing a surface of the inspection object having the plurality of inspection target devices formed thereon, the inspection target device map image showing needle mark inspection results with respect to the plurality of inspection target devices at positions corresponding respectively to the plurality of inspection target devices, and a captured image of the electrodes. Display contents of the needle mark scatter plot image, the inspection object map image, and the captured image are linked with each other.

According to the present disclosure, it is easy to perform a detailed analysis based on a needle mark formed on an electrode formed on an inspection object.

DETAILED DESCRIPTION

Figure 1:
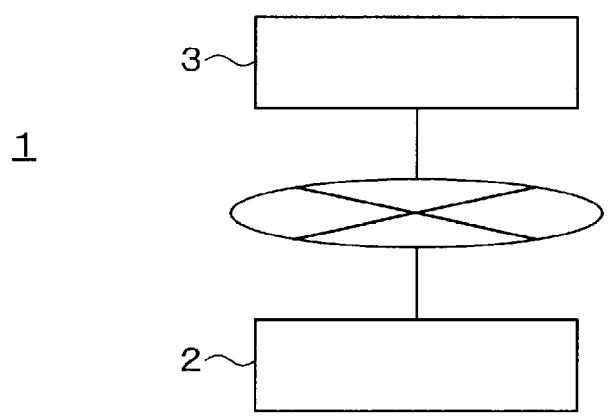
FIG. 1 is a view illustrating a schematic configuration of a monitoring system including an analysis device according to an embodiment.

In a semiconductor manufacturing process, a number of electronic devices each having a circuit pattern are formed on a semiconductor wafer (hereinafter, referred to as a "wafer"). The formed electronic devices are subjected to inspection such as electrical characteristic inspection, and are sorted into good-quality products and defective products. Electronic devices are inspected using an inspection apparatus, for example, in a state of the wafer before the wafer is divided into each electronic device.

An electronic device inspection apparatus called a prober or the like is provided with a probe card having probes, which come into contact with electronic devices during electrical characteristic inspection. In the electrical characteristic inspection, respective probes provided on the probe card are aligned with electrodes (for example, electrode pads) provided on the electronic devices so as to come into contact with the electrodes, and then the probe card and the electronic devices are brought close to each other. Then, in the state in which the probes are in contact with respective electrodes, an electric signal is supplied to the electronic devices via respective probes. Based on an electric signal output from an electronic device via each probe, it is determined whether or not the electronic device is defective.

As described above, when a probe comes into contact with an electrode during electrical characteristic inspection, a needle mark is generated on the electrode. In the electrical characteristic inspection, a state of the needle mark described above is also inspected for the purpose of determining whether or not the probe has come into proper contact with the electrode during the electrical characteristic inspection.

In Patent Document 1, an image of an electrode pad is captured, and the quality of a needle mark included in the image is determined based on the image obtained by the capturing.

However, simply acquiring a needle mark inspection result such as the result of determining the quality of a needle mark for each electrode pad may not be sufficient. For example, in electrical characteristic inspection, when probes on a probe card are brought into contact with a large number of electronic devices on a wafer at the same time and the electronic devices are collectively inspected, information on the tendency of the results of determination of a needle mark state in the plane of the wafer and the like may be required. By sequentially displaying the results of capturing or the results of determining the quality of a needle mark state as in Patent Document 1, it seems possible to acquire information on the tendency of the results of determination of the needle mark state in the plane of the wafer, but it takes a long time and is difficult.

Therefore, the technique according to the present disclosure makes it easy to perform a more detailed analysis based on needle marks formed on electrodes formed on an inspection object.

Hereinafter, an analysis device and an image generation method according to the present embodiment will be described with reference to the drawings. In the specification and drawings, elements having substantially the same functional configurations will be denoted by the same reference numerals, and redundant explanations thereof will be omitted.

FIG. 1 is a view illustrating a schematic configuration of a monitoring system 1 including an analysis device according to the present embodiment.

The monitoring system 1 of FIG. 1 monitors an inspection apparatus 2, and includes the inspection apparatus 2 and an analysis device 3. In the monitoring system 1, the inspection apparatus 2 and the analysis device 3 are connected to each other via a network such as a local area network (LAN) or the Internet. For the sake of simplification of the description, in the example of FIG. 1, one inspection apparatus 2 is connected to one analysis device 3, but a plurality of inspection apparatuses 2 may be connected.

Figure 2:
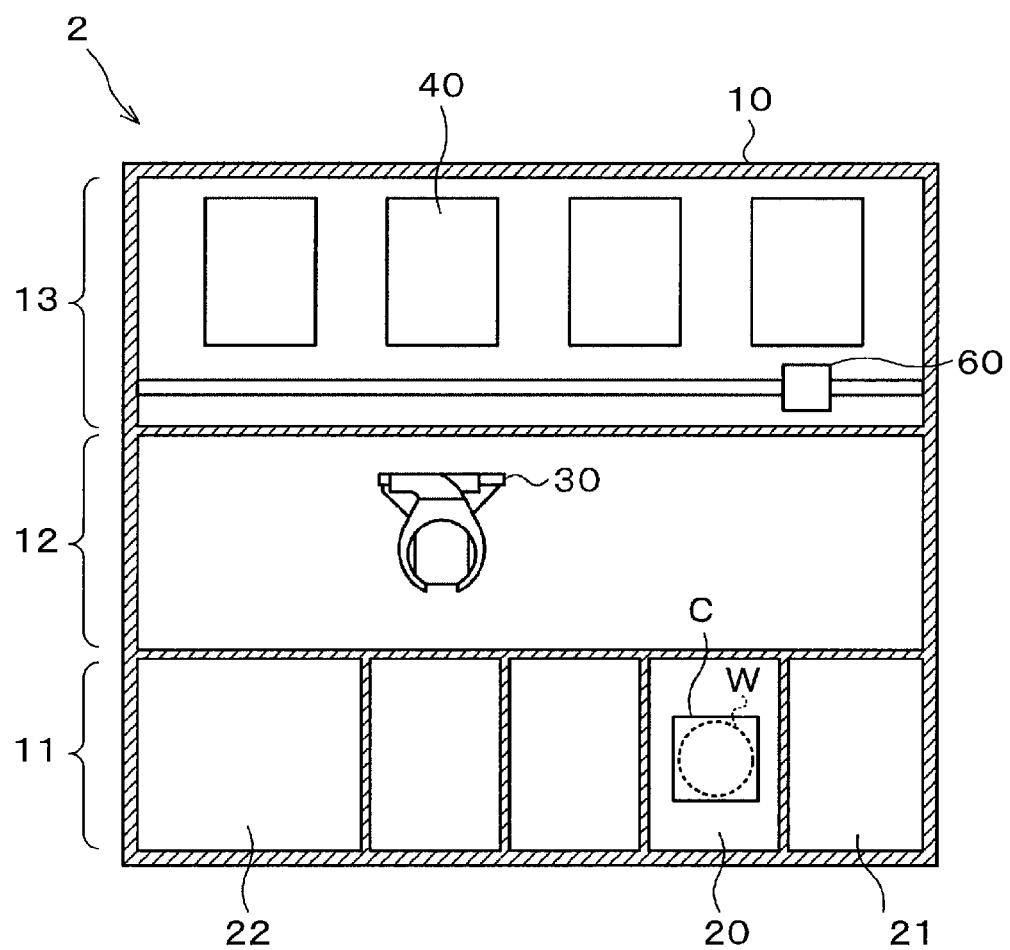
FIG. 2 is a horizontal cross-sectional view illustrating a schematic configuration of an inspection apparatus.
Figure 3:
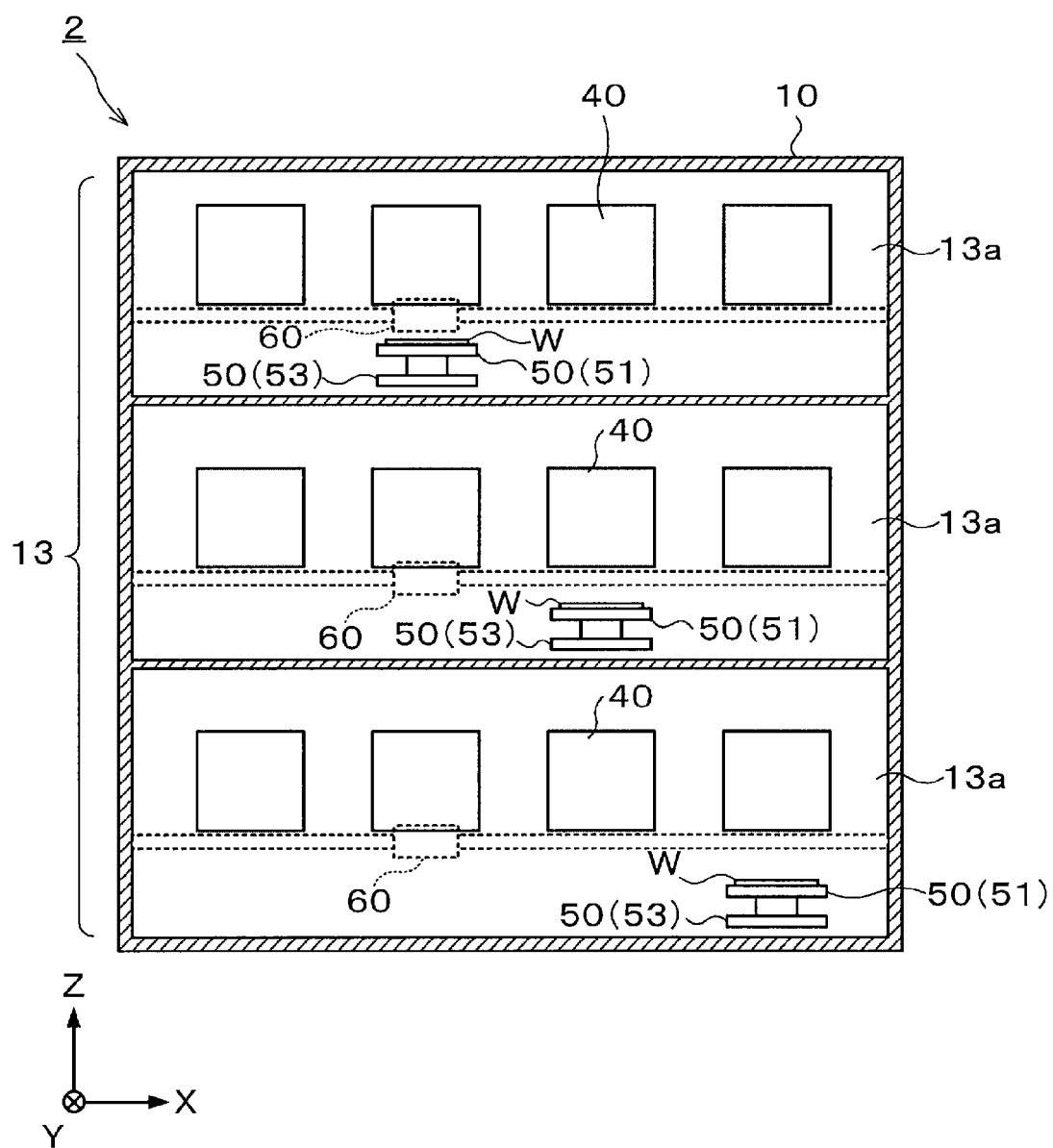
FIG. 3 is a vertical cross-sectional view illustrating a schematic configuration of the inspection apparatus.
Figure 4:
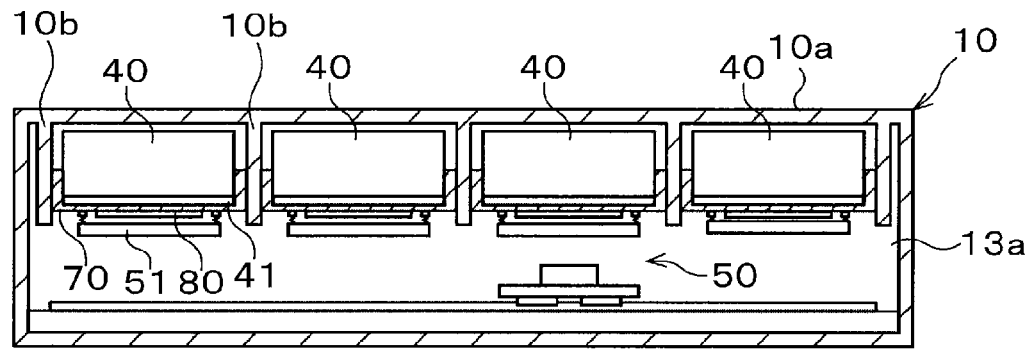
FIG. 4 is a vertical cross-sectional view illustrating a configuration in a divided area of the inspection apparatus.
Figure 5:
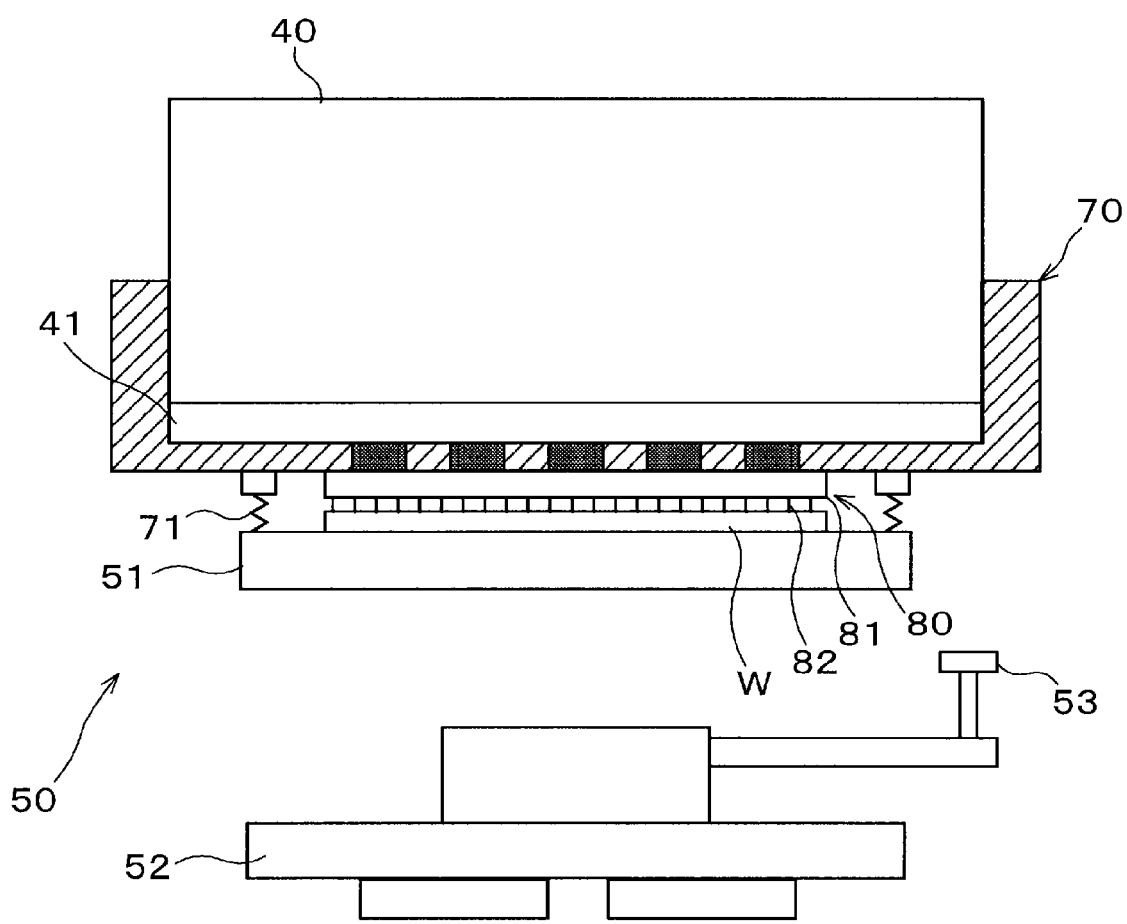
FIG. 5 is a partially enlarged view of FIG. 4.

FIGS. 2 and 3 are a horizontal cross-sectional view and a vertical cross-sectional view, respectively, each of which illustrates a schematic configuration of the inspection apparatus 2. FIG. 4 is a vertical cross-sectional view illustrating a configuration in a divided area 13a of the inspection apparatus of FIGS. 2 and 3. FIG. 5 is a partially enlarged view of FIG. 4. In addition, a lower camera, which will be described later, is illustrated only in FIG. 5.

As illustrated in FIGS. 2 and 3, the inspection apparatus 2 includes a housing 10. A loading/unloading area 11, a transfer area 12, and an inspection area 13 are provided in the housing 10. The loading/unloading area 11 is an area in which loading/unloading of a wafer W as an inspection object is performed with respect to the inspection apparatus 2. The transfer area 12 is an area that connects the loading/unloading area 11 and the inspection area 13. Further, the inspection area 13 is an area in which electrical characteristic inspection of electronic devices as inspection target devices formed on the wafer W or needle mark inspection of needle marks formed on the electrodes of the electronic devices during the electrical characteristic inspection is performed.

The loading/unloading area 11 is provided with a port 20 configured to accommodate a cassette C accommodating a plurality of wafers W, a loader 21 configured to accommodate a probe card, and a controller 22 configured to control each component of the inspection apparatus 2. The controller 22 is configured with, for example, a computer provided with, for example, a CPU and a memory.

In the transfer area 12, a transfer device 30 configured to be movable in the state of holding, for example, the wafer W, is disposed. The transfer device 30 transfers the wafer W between the cassette C within the port 20 of the loading/unloading area 11 and the inspection area 13. In addition, the transfer device 30 transfers a probe card that requires maintenance among probe cards fixed to a pogo frame, which will be described later, within the inspection area 13 to the loader 21 in the loading/unloading area 11. In addition, the transfer device 30 transfers a new or maintained probe card from the loader 21 to the pogo frame in the inspection area 13.

A plurality of testers 40 are provided in the inspection area 13. Specifically, as illustrated in FIG. 3, the inspection area 13 is divided into three areas in the vertical direction, and each divided area 13a is provided with a tester row including four testers 40 arranged in the horizontal direction (the X direction in the figure). Hereinbelow, a space in which each tester 40 is provided may be referred to as a stage. In addition, each divided area 13a is provided with one positioning part 50 and one upper camera 60. The numbers and arrangements of testers 40, positioning parts 50, and cameras 60 may be arbitrarily selected.

Each tester 40 transmits and receives an electric signal for electrical characteristic inspection to and from the wafer W.

The positioning part 50, on which the wafer W is placed, is configured to perform positioning (alignment) of the wafer W placed thereon and a probe card disposed below each of the testers 40, and is provided to be movable in an area below the testers 40.

The upper camera 60 captures an image of the top surface of the wafer W located below the upper camera 60. Specifically, the upper camera 60 captures images of electrode pads as electrodes of electronic devices formed on the top surface of the wafer W or the like. The capturing results by the upper camera 60 are used in the inspection apparatus 2, for example, for needle mark inspection, as will be described. In addition, the capturing results by the upper camera 60 are used for positioning the probe cards arranged below the testers 40 and the wafer W placed on the positioning part 50. The upper camera 60 is configured to be movable horizontally. Therefore, for example, during the needle mark inspection or the above-mentioned positioning, the upper camera 60 may be positioned in front of each tester 40 in the divided area 13a provided with the upper camera 60.

In the inspection apparatus 2 configured as described above, while the transfer device 30 transfers the wafer W toward one tester 40, another tester 40 may inspect the electrical characteristics of electronic devices formed on another wafer W.

Next, configurations related to the testers 40 and the positioning part 50 will be described.

As illustrated in FIGS. 4 and 5, each tester 40 has a tester mother board 41 provided horizontally on the bottom portion thereof. A plurality of inspection circuit boards (not illustrated) are mounted on the tester motherboard 41 in an upright state. A plurality of electrodes are provided on the bottom surface of the tester motherboard 41.

In addition, below each tester 40, a pogo frame 70 and a probe card 80 are provided in that order from the upper side.

The pogo frame 70 is configured to support the probe card 80 and electrically connect the probe card 80 and the tester 40 (specifically, the electrodes on the bottom surface of the tester motherboard 41). The pogo frame 70 is arranged to be located between the tester 40 and the probe card 80.

The probe card 80 is held on the bottom surface of the pogo frame 70 by vacuum attraction in the state of being positioned at a predetermined position.

In addition, a bellows 71 extending vertically downward is attached to the bottom surface of the pogo frame 70 so as to surround the installation position of the probe card 80. The bellows 71 is provided so as to form a sealed space including the probe card 80 and the wafer W in the state in which the wafer W on a chuck top (to be described later) is in contact with the probes (to be described later) of the probe card 80.

The probe card 80 has a disk-shaped card body 81, and further includes a plurality of probes 82, which are needle-shaped terminals extending downward from the bottom surface of the card body 81. When inspecting the electrical characteristics of a plurality of electronic devices of the same type formed on the wafer W, the plurality of probes 82 are brought into contact with a plurality of electrode pads of each of the plurality of electronic devices at the same time. An electric signal for inspection is transmitted and received between the tester motherboard 41 and each electronic device on the wafer W via each probe 82.

The positioning part 50 is configured to place a chuck top 51 thereon. The chuck top 51 holds the wafer W placed on the positioning part 50 through attraction or the like.

In addition, the positioning part 50 includes an aligner 52. The aligner 52 is a positioning mechanism configured to be capable of holding the chuck top 51, on which the wafer W is placed, through vacuum attraction or the like, and to position the wafer W placed on the chuck top 51 and the probe 82 during electrical characteristic inspection. The aligner 52 is configured to be movable in the vertical direction (Z direction in the figure), the front-rear direction (Y direction in the figure), and the left-right direction (X direction in the figure) in the state of holding the chuck top 51.

By moving the aligner 52, the wafer W on the chuck top 51 and the probes 82 of the probe card 80 are positioned, and the sealed space including the probe card 80 and the wafer W can be formed by the bellows 71 or the like. When the sealed space is evacuated by a vacuum mechanism (not illustrated), the holding of the chuck top 51 by the aligner 52 is released, and the aligner 52 is moved downward, the chuck top 51 is removed from the aligner 52 and attracted to the side of the pogo frame 70. In this state, the electrical characteristic inspection is performed.

In addition, the positioning part 50 is provided with a lower camera 53. Before the probes 82 of the probe card 80 and the wafer W are brought into contact with each other, the lower camera 53 captures images of the probes 82 located above the lower camera 53. The results of this capturing are used in the inspection apparatus 2 for positioning, for example, the imaged probes 82 and the wafer W placed on the positioning part 50.

In the inspection apparatus 2 having the testers 40 and the positioning part 50 described above, after the electrical characteristic inspection, needle mark inspection based on the capturing results by the upper camera 60 is performed by, for example, the controller 22. In the needle mark inspection, for each electrode pad, the size of a needle mark (specifically, the width of a needle mark) and a position of the needle mark (specifically, a position of the center of gravity of the needle mark) with respect to the electrode pad are obtained based on the image captured by the upper camera 60, and the state of the needle mark is determined based on the acquisition result. This needle mark inspection is performed on some or all of the plurality of electronic devices formed on the wafer W. In the following description, the needle mark inspection is assumed to be performed on some electronic devices. In addition, the needle mark inspection is performed on each of all the electrode pads of the inspection target electronic devices. The shapes of the plurality of electrode pads formed on each electronic device may be common among the electrode pads or may be different from each other.

The inspection apparatus 2 acquires information pertaining to a needle mark inspection result (hereinafter, "needle mark inspection result information") including the information on a result of determination of a needle mark state in each electrode pad for each wafer W, and outputs the needle mark inspection result information to the analysis device 3 via a network. The needle mark inspection result information includes, in addition to the information on the result of determination of a needle mark state for each electrode pad, the position information of needle marks with respect to respective electrode pads, the position information of electrode pads from which the above-mentioned determination result was obtained, captured images of the electrode pads from which the above-mentioned determination result was obtained, and identification information of the captured images, and the like.

Figure 6:
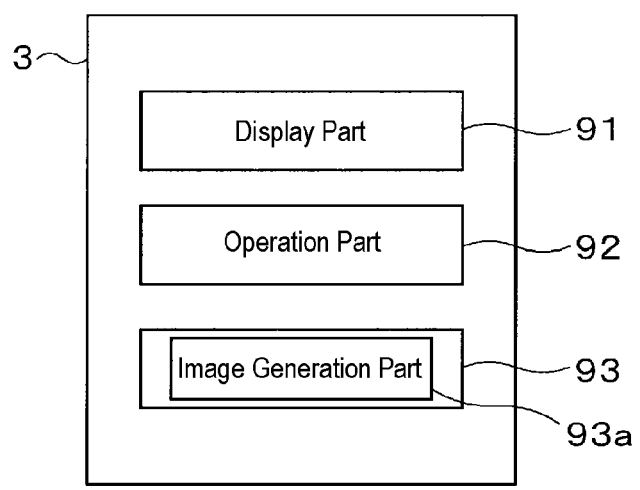
FIG. 6 is a view illustrating a schematic configuration of the analysis device.

FIG. 6 is a view illustrating a schematic configuration of the analysis device 3.

The analysis device 3 includes a display part 91, an operation part 92, and a controller 93.

The display part 91 displays various images, and includes, for example, a liquid crystal display or an organic EL display.

The operation part 92 is a part on which operation input is made by the user, and includes, for example, a keyboard or a mouse.

The controller 93 is a computer including, for example, a CPU and a memory, and includes a program storage part (not illustrated). The program storage part stores programs for controlling a process in the analysis device 3. A program for implementing an image generation process to be described later is also stored. The programs may be recorded in a computer-readable storage medium, and may be installed on the controller 93 from the storage medium.

The controller 93 includes an image generation part 93a configured to generate an image to be displayed on the display part 91.

The image generation part 93a generates an image for analyzing an inspection result in the inspection apparatus 2 (hereinafter referred to as an "analysis image") based on the needle mark inspection result information from the inspection apparatus 2. The analysis image generation function of the image generation part 93a is provided in the image generation part 93a (specifically, the controller 93) by processing of the CPU according to an instruction of a program written in, for example, an object-oriented programming language.

The image generation part 93a is able to generate an analysis image as a user interface image (hereinafter, referred to as an "UI image") including the analysis image.

Figure 7:
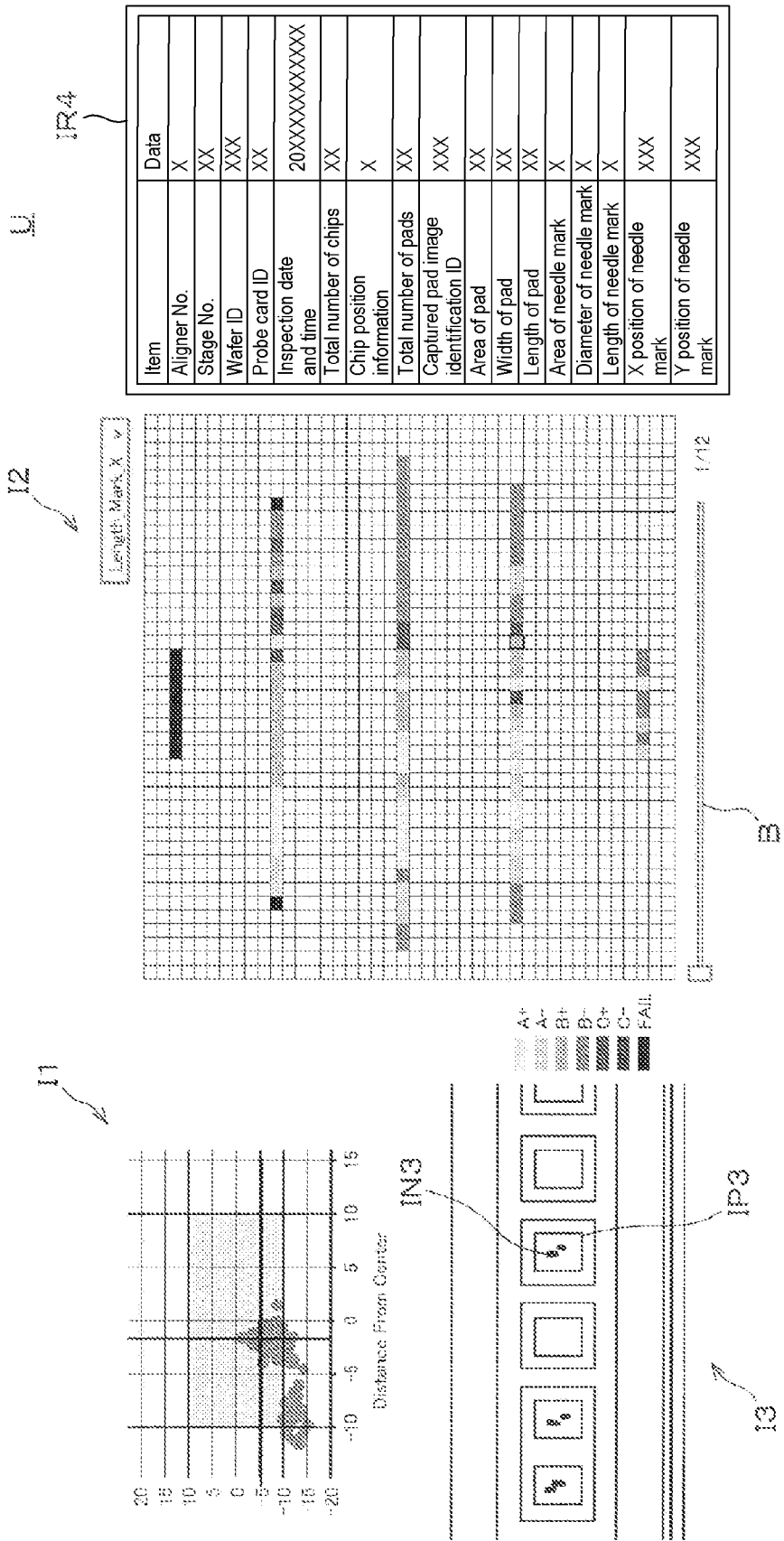
FIG. 7 is a view illustrating an example of a user interface image.
Figure 8:
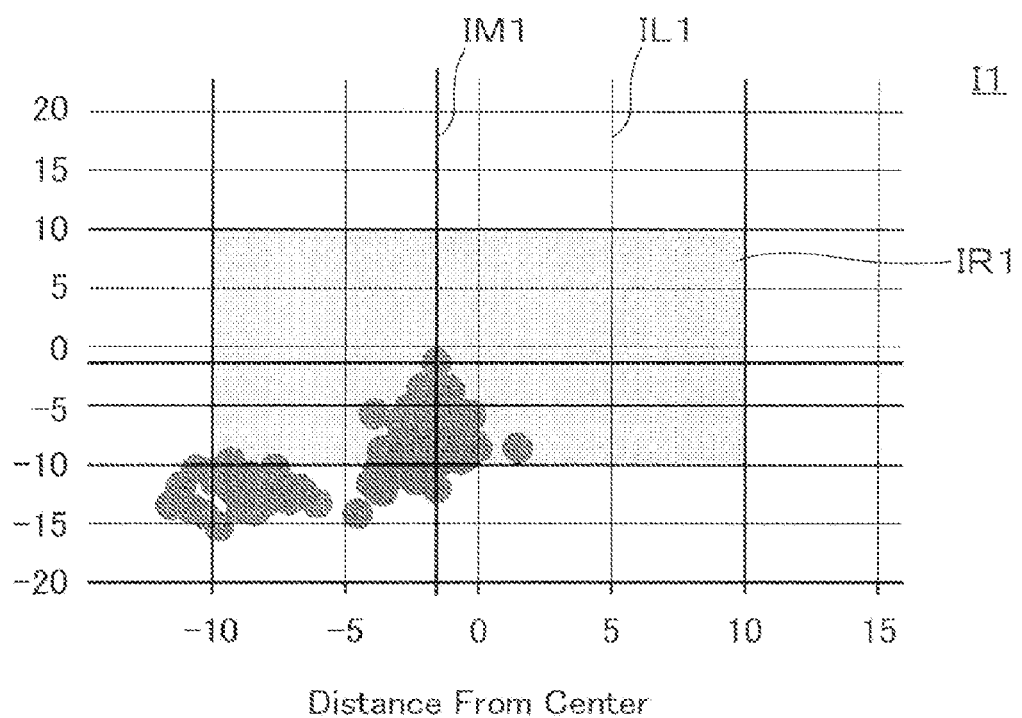
FIG. 8 is a partially enlarged view of FIG. 7, illustrating an example of a needle mark scatter plot image.
Figure 9:
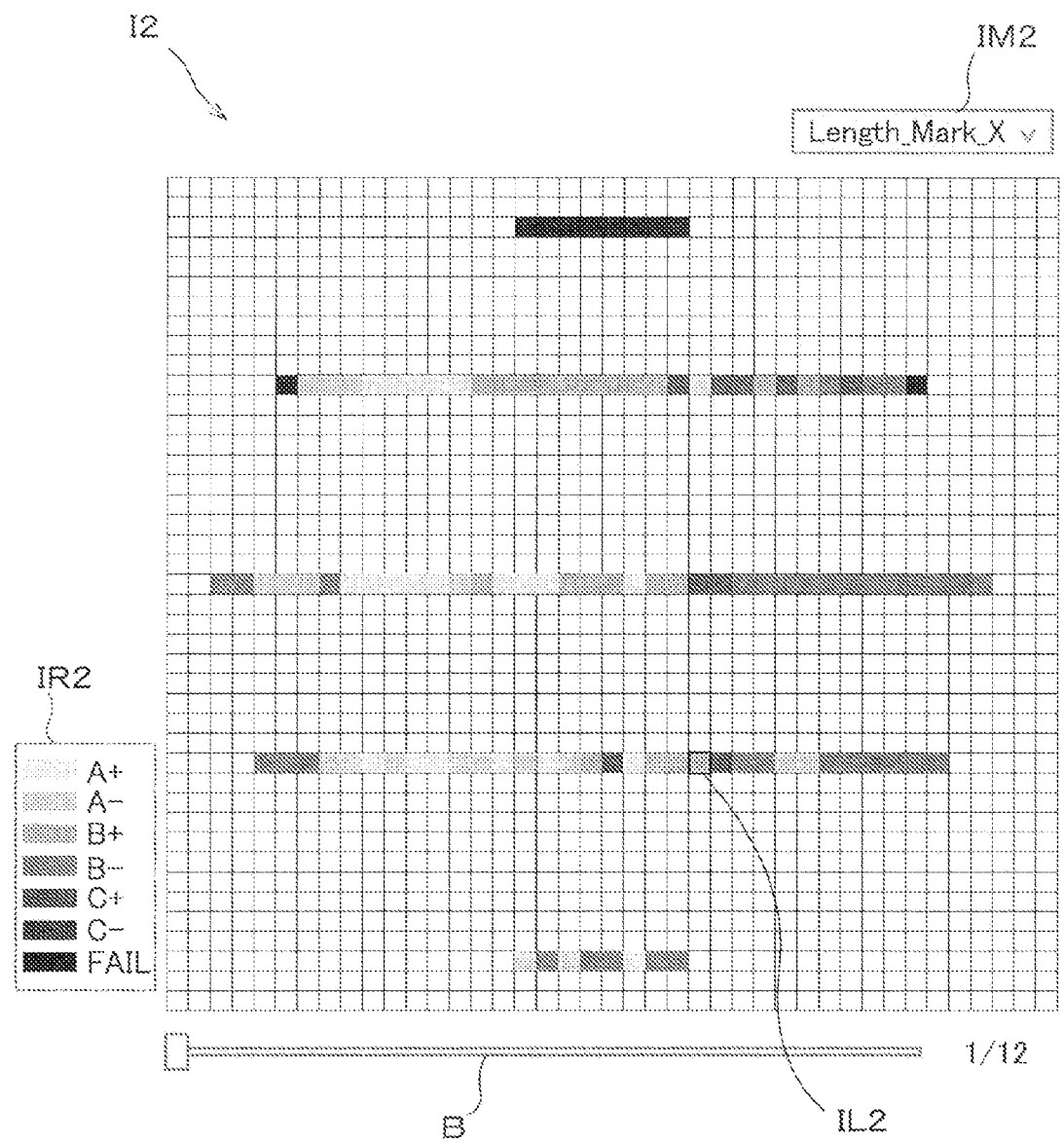
FIG. 9 is a partially enlarged view of FIG. 7, illustrating an example of a wafer map image.

FIG. 7 is a view illustrating an example of the UI image generated by the image generation part 93a. FIGS. 8 and 9 are partially enlarged views of the UI image of FIG. 7. Electronic devices are formed on the wafer W over five or more rows. The example illustrated in these figures is a UI image obtained when needle marks were inspected on five rows of electronic devices among the electronic devices formed on the wafer W. In the following description, it is assumed that 12 electrode pads (first to twelfth electrode pads) are formed in one electronic device.

The UI image U of FIG. 7 includes a needle mark scatter plot image I1, a wafer map image I2 as an inspection object map image, a captured image I3, and a character information display area IR4.

The needle mark scatter plot image I1 is an image showing the positions of needle marks with respect to a specific electrode pad in each of the electronic devices of an inspection target wafer W in an overlapped manner. In the needle mark scatter plot image I1 in the example of the figure, the position of a needle mark with respect to the first electrode pad among the 12 electrode pads is indicated by a gray "●" mark. The position of a needle mark is specifically the position of the center of gravity of the needle mark. As illustrated in FIG. 8, the needle mark scatter plot image I1 shows a scale line IL1 indicating a distance from the center of an electrode pad in a predetermined direction (in the width direction and length direction of the electrode pad) in the order of μm. In addition, in the needle mark scatter plot image I1, the area IR1 in which the state of a needle mark can be determined to be good is indicated with a color so as to be distinguished from other areas.

Furthermore, in the needle mark scatter plot image I1, a special display is made for some of needle mark positions shown in the needle mark scatter plot image I1. Specifically, in the needle mark scatter plot image I1, a special display in which a cross marker IM1 is superimposed and displayed on one needle mark position shown in the needle mark scatter plot image I1 is made. The special display is not limited to this method, and for example, a display in which a needle mark position to be specially displayed and another needle mark position can be distinguished by a color may be made as a special display.

The wafer map image I2 is an image schematically showing the surface of a wafer on which electronic devices are formed, and shows, in a portion corresponding to each electronic device, a needle mark state determination result for a specific electrode pad of the electronic device. In the wafer map image I2 of FIG. 9, one colored square means an electronic device on which needle mark inspection has been performed. In the wafer map image I2 of FIG. 9, the state determination results of the needle mark with respect to the first electrode pad among the 12 electrode pads is indicated in seven stages of A+, A−, B+, B−, C+, C−, and FAIL, and the needle mark state determination results are shown with colors. A correspondence information display area IR2 provided at the lower left side of the outside of the wafer map image I2 shows the correspondence relationship between needle mark state determination results and colors.

In addition, the wafer map image I2 of the example in the figure shows the state determination result regarding the sizes of the needle marks in a predetermined direction (e.g., the width direction (X direction) of the electrode pads). A switching menu IM2 provided at the upper right side of the outside of the wafer map image I2 is for switching the type of the state determination result to be displayed. For example, when the user operates the switching menu IM2, the state determination results in the wafer map image I2 is switched from the sizes of the needle marks in the width direction of the electrode pads to the sizes of the needle marks in the length direction of the electrode pads.

In the wafer map image I2, a portion of the portion corresponding to the electronic devices shown in the wafer map image I2 is specially displayed. Specifically, in the wafer map image I2, a special display in which a thick black frame line IL2 is superimposed on a portion corresponding to one electronic device shown in the wafer map image I2 is made. The special display is not limited to this method, and, for example, an image of an arrow pointing to a portion corresponding to an electronic device to be specially displayed may be displayed.

The captured image I3 is an image acquired by capturing an electrode pad IP3. When electrical characteristic inspection is properly performed, a needle mark IN3 is formed on the electrode pad IP3 shown by the captured image I3.

The character information display area IR4 is an area for displaying information on needle marks, information on electrode pads, and the like in character information. In this example, both information on needle marks and information on electrode pads are displayed in the character information display area IR4, but only one of them may be displayed.

In the character information display area IR4, as information on needle marks, information on the areas, widths, and lengths of needle marks, information on the positions of the needle marks in the width direction (X direction), or information on the positions of the needle marks in the length direction (Y direction) is displayed. In addition, the character information display area IR4 includes, for example, information on the areas, widths, and lengths of electrode pads, or information on the number of electrode pads per electronic device, as information on electrode pads. The character information display area IR4 may further display identification information of a stage (the space provided with the tester 40) or the aligner 52 used during the inspection on the wafer W to be displayed, and may display identification information of an image shown as the captured image I3.

In the UI image U, a scroll bar B provided below the outside of the wafer map image I2 is for selecting an electrode pad to be displayed as a needle mark inspection result from the first to twelfth electrode pads formed on the electronic device.

In the UI image U configured as described above, the display contents of the needle mark scatter plot image I1, the wafer map image I2, the captured image I3, and the character information display area IR4 are linked to each other. Specifically, the content specially displayed in the needle mark scatter plot image I1, the content specially displayed in the wafer map image I2, the content displayed in the captured image I3, and the content displayed in the character information display area IR4 are linked to each other For example, when the user's selection operation for the position of a needle mark indicated by "●" in the needle mark scatter plot image I1 is input via the operation part 92, the image generation part 93a generates a UI image U including the following contents A1 to A4:

(A1) a needle mark scatter plot image I1 in which the position of the needle mark corresponding to the operated portion, that is, the needle mark selected by the user is specially displayed;

(A2) a wafer map image I2 in which the electronic device (the portion corresponding thereto) having the electrode pad on which the needle mark specially displayed in the needle mark scatter image I1 is formed is specially displayed;

(A3) a captured image I3 showing the electrode pad on which the needle mark specially displayed on the needle mark scatter plot image I1 is formed; and (A4) a character information display area IR4 in which information on the needle mark specially displayed in the needle mark scatter plot image I1 and information on the electrode pad on which the needle mark is formed are displayed.

In addition, for example, when the user's selection operation for the display portion of an electronic device indicated by a square in the wafer map image I2 is input via the operation part 92, the image generation part 93a generates a UI image U including the following contents B1 to B4:

(B1) a wafer map image I2 in which the electronic device corresponding to the operated portion, that is, the electronic device (the portion corresponding thereto) selected by the user is specially displayed;

(B2) a needle mark scatter plot image I1 in which the position of the needle mark formed on the electrode pad to be displayed, which is possessed by the electronic device specially displayed in the wafer map image I2, is specially displayed;

(B3) a captured image I3 showing the electrode pad to be displayed, which is possessed by the electronic device specially displayed in the wafer map image I2; and (B4) a character information display area IR4 in which information on the electrode pad to be displayed, which is possessed by the electronic device specially displayed in the wafer map image, and information on the needle mark formed on the electrode pad, are displayed.

In other words, the UI image U includes the following contents C1 to C4:

(C1) a captured image I3 showing an electrode pad to be displayed of an electronic device selected by the user;

(C2) a needle mark scatter plot image I1 in which the position of the needle mark formed on the electrode pad shown in the captured image I3 is specially displayed;

(C3) a wafer map image I2 in which the electronic device (the portion corresponding thereto) selected by the user is specially displayed; and (C4) a character information display area IR4 in which information on an electrode pad to be displayed, which is possessed by the electronic device selected by the user, and information on the needle mark formed on the electrode pad, are displayed.

Figure 10:
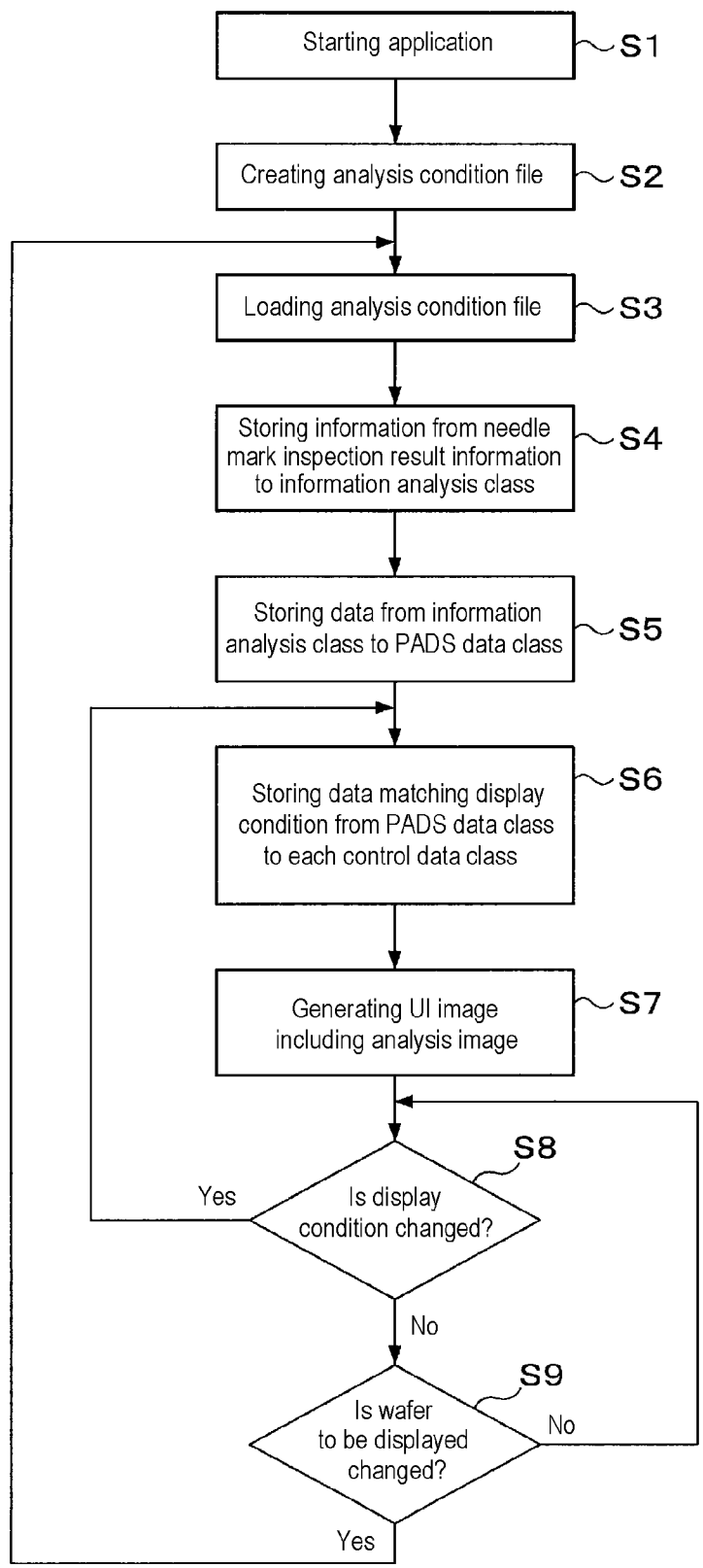
FIG. 10 is a flowchart for explaining an example of image generation process executed by an image generation part.

Next, an example of the image generation process by the image generation part 93a will be described. FIG. 10 is a flowchart for explaining the example of the image generation process by the image generation part 93a.

When an application for analyzing an inspection result in the inspection apparatus 2 (hereinafter, referred to as an "analysis application") is started (step S1), the image generation part 93a creates an analysis condition file (step S2). In the analysis condition file, for example, information on a location where needle mark inspection result information is stored in the analysis device 3, information indicating the correspondence relationship between needle mark state determination results and colors, or the like is described.

The needle mark inspection result information is acquired for each wafer W. For example, when the analysis application is started, the image generation part 93a loads analysis conditions for the wafer W selected by the user, that is, develops the analysis conditions on a memory (not illustrated) (step S3).

Then, the image generation part 93a reads, for example, the needle mark inspection result information about the wafer W selected by the user, and stores predetermined information to an information analysis class (step S4).

Subsequently, the image generation part 93a executes a predetermined method included in the information analysis class, and stores the predetermined information in the information analysis classes to a PADS data class (step S5).

Subsequently, a method according to display conditions included in the PADS data class is executed. As a result, the image generation part 93a stores information matching the display conditions in the PADS data class to each control data class for generating a UI image U (step S6). The respective control data classes include a control data class for drawing a needle mark scatter plot image I1, a control data class for drawing a wafer map image I2, a control data class for drawing a captured image I3, a data class for drawing a character information display area IR4, and the like. The above-mentioned display conditions are, for example, conditions for designating the following (i) to (iv):

(i) A needle mark to be displayed as the needle mark inspection result, which is selected by an operation on the needle mark scatter plot image I1 or the like;

(ii) An electronic device to be displayed as the needle mark inspection result, which is selected by an operation on the wafer map image I2 or the like;

(iii) the type of state determination result, which is selected by the operation on the switching menu IM2 (specifically, which of the state determination result related to the size in the width direction and the state determination result related to the size in the length direction is used); and (iv) An electrode pad to be displayed as the needle mark inspection result, which is selected by an operation on the scroll bar B or the like.

Subsequently, a predetermined method included in each control data class is executed, and a program for drawing a UI image U (including a program for generating a needle mark scatter plot image I1, a wafer map image I2, or the like as a drawing object) is executed. As a result, the image generation part 93a generates a UI image U based on the result of execution of the predetermined method included in each control data class, the information included in each control data class, and the analysis conditions included in the analysis condition file (step S7). The generated UI image U includes a highlighted needle mark scatter plot image I1, a wafer map image I2, a captured image I3, and a character information display area IR4, and is displayed on the display part 91.

By performing image generation using a dedicated data class for a drawing object (control) in this way, it is possible to make a high-speed image display. In other words, it is possible to switch images at high speed.

When the display conditions are changed by the operation on the needle mark scatter plot image I1, the wafer map image I2, the switching menu IM2, or the scroll bar B, or the like ("YES" in step S8), the process in the image generation part 93a is returned to step S6. Then, the image generation part 93a stores the information, which matches the changed display conditions in the PADS data class, to each control data class, based on the acquired information of the changed display conditions. Subsequently, when the process of step S7 is performed, a new UI image U, which matches the changed display conditions, is generated.

As the display conditions, for example, when the needle mark to be displayed is changed by an operation on the needle mark scatter plot image I1, a new UI image U including the following a1 to a4 is generated:

(a1) a needle mark scatter plot image I1 in which the position of the changed needle mark is specially displayed;

(a2) a wafer map image I2 in which the electronic device having the changed needle mark is specially displayed;

(a3) a captured image I3 showing the electrode pad on which the changed needle mark is formed; and (a4) a character information display area IR4 in which information on the changed needle mark and information on the electrode pad on which the needle mark is formed are displayed.

As the display conditions, for example, when the electronic device to be displayed is changed by an operation on the wafer map image I2, a new UI image U including the following b1 to b4 is generated:

(b1) a wafer map image I2 in which the changed electronic device is displayed;

(b2) a needle mark scatter plot image I1 in which the position of the needle mark formed on an electrode pad to be displayed, which is possessed by the changed electronic device, is specially displayed;

(b3) a captured image I3 showing the electrode pad to be displayed, which is possessed by the changed electronic device; and (b4) a character information display area IR4 in which information on the electrode pad to be displayed, which is possessed by the changed electronic device, and information on the needle mark formed on the electrode pad are displayed.

When an object to be displayed, namely, the wafer W to be analyzed, is changed by operating a wafer selection button (not illustrated) ("YES" in step S9), the process in the image generation part 93a is returned to step S3, and after loading the analysis condition file for the changed wafer W, predetermined information included in the needle mark inspection result information for the changed wafer W is stored in the information analysis class. Then, when the processes of step S5 and subsequent steps are performed, a UI image U including a new needle mark scatter plot image I1 and the like is generated.

In the present embodiment, the image generation part 93a generates a UI image U having the above-mentioned needle mark scatter plot image I1, wafer map image I2, and captured electrode pad image. From the needle scatter plot image I1, it is easy for the user to visually recognize the tendency of the contact positions and alignment accuracy between electrode pads and probes between electronic devices. In addition, from the wafer map image I2, it is easy for the user to visually recognize the tendency of needle mark state determination results in the plane of the wafer W, in which portion of the wafer W the needle mark state is not good, and the like.

Then, in the UI image U, the display contents of the needle mark scatter plot image I1 and the wafer map image I2 are linked to each other. Therefore, it is easy for the user to visually recognize the relationship between the tendency of needle mark state determination results in the plane of the wafer W and the tendency of the positions of needle marks with respect to electrode pads on the wafer. In addition, it is possible to analyze the approach directions of probes by combining the display contents of the needle mark scatter plot image I1 and the wafer map image I2, which are linked to each other, with the information of probe forming directions. Furthermore, since the captured image I3 is also linked, it is possible to perform more detailed analysis of needle marks. Specifically, since, for example, the captured image I3 is raw data showing the needle marks on respective electrode pads, it is possible to perform the analysis work more smoothly, by looking at processing data, such as the positions of the centers of gravity of needle marks (the needle mark scatter plot image I1), and the position data of a target electronic device in the plane of the wafer W (data of the wafer map image I2) while looking at the raw data.

In addition, in the present embodiment, since the content specially displayed in the needle mark scatter plot image I1, the content specially displayed in the wafer map image I2, and the content of the captured image I3 are linked with each other, it is possible to perform more detailed analysis of needle marks.

In the present embodiment, the display contents of the needle mark scatter plot image I1, the wafer map image I2, the captured image I3, and the character information display area IR4 are linked to each other. Therefore, it is easy to perform a more detailed analysis of needle marks.

In the present embodiment, the wafer map image I2 shows needle mark state determination results in three or more stages (in this example, in seven stages). Therefore, from the wafer map image I2, the user is capable of recognizing not only simply whether the state of a needle mark is good or bad, but also, for example, whether the good state is close to the bad state. Therefore, for example, by sequentially displaying analysis images having the wafer map image I2 in time series, the user is capable of recognizing a change over time in the states of needle marks and capable of predicting the failure of the probe card 80 or the like from the change over time.

In the present embodiment, the wafer map image I2 shows needle mark state determination results with colors. Therefore, from the wafer map image I2, the user is capable of visually recognizing the states of needle marks of each electronic device and the tendency of the states of needle marks in the plane of the wafer W in a short time.

Figure 11:
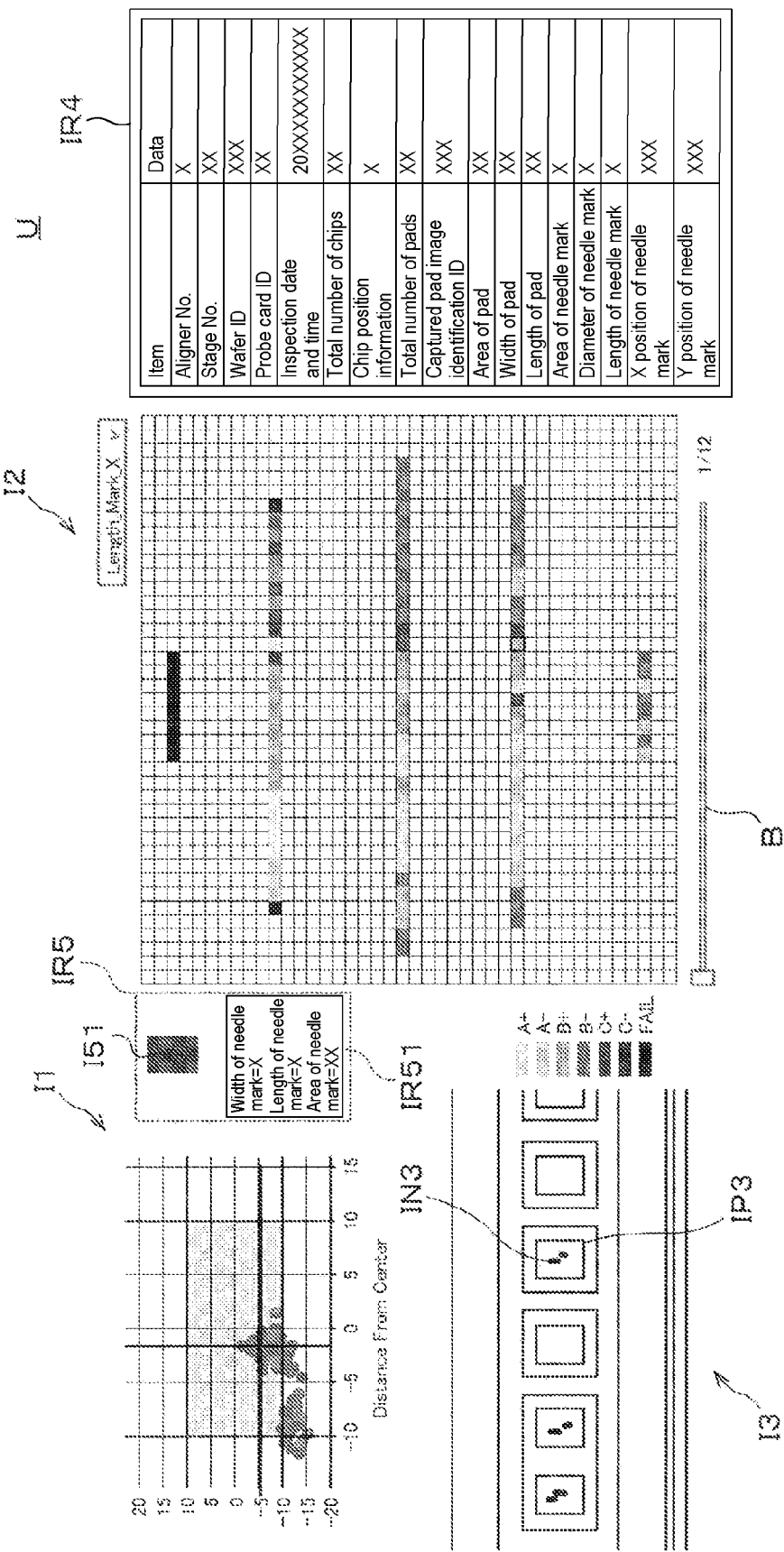
FIG. 11 is a view illustrating another example of the user interface image.

FIG. 11 is a view illustrating another example of the UI image U.

The UI image U of the example of FIG. 11 has a needle mark shape information display area IR5 for displaying needle mark shape information, in addition to a needle mark scatter plot image I1, a wafer map image I2, a captured image I3, and a character information display area IR4. In this example, the needle mark shape information display area IR5 is provided near the needle mark scatter plot image I1, specifically, at a position between the needle mark scatter plot image I1 and the wafer map image I2.

The needle mark shape information display area IR5 has a shape image I51, which shows the shape of a needle mark as an image, and a character information display area IR51, which shows information about the shape of a needle mark as character information. In the character information display area IR51, information, such as the width, length, and area of a needle mark, is displayed as character information. When it is determined that the state of a needle mark shown by the shape image I51 is bad, the shape image I51 may be displayed in a color different from that in the case in which the shape image I51 is not bad. As a result, it is easy to recognize the results of inspection of needle marks in a shorter time.

In addition, the image generation part 93a also generates the UI image U of the example of FIG. 11 based on the needle mark inspection result information acquired from the inspection apparatus 2 as in the example of FIG. 7.

In the UI image U of FIG. 11, the display content of the needle mark shape information display area IR5 is linked with the display content of each of the needle mark scatter plot image I1, the wafer map image I2, the captured image I3, and the character information display area IR4.

For example, when the user's selection operation for the position of a needle mark indicated by "●" in the needle mark scatter plot image I1 is input via the operation part 92, in addition to the above-mentioned contents A1 to A4, the image generation part 93a generates a UI image U including the following content A5:

(A5) a needle mark shape information display area IR5 in which information on the shape of a needle mark specially displayed in the needle mark scatter plot image I1 is displayed.

In addition, for example, when the user's selection operation for the display portion of an electronic device indicated by a square in the wafer map image I2 is input via the operation part 92, in addition to the above-mentioned contents B1 to B4, the image generation part 93a generates a UI image U including the following content B5:

(B5) a needle mark shape image display area IR5 in which information on the shape of the needle mark formed on the electrode pad to be displayed, which is possessed by the electronic device specially displayed in the wafer map image, is displayed.

In the foregoing description, the inspection apparatus 2 and the analysis device 3 are separate bodies, but the function of the analysis device 3 described above may be provided in the inspection apparatus 2.

In the forgoing description, electrodes of electronic devices have been described as electrode pads, but may be bump electrodes.

It should be understood that the embodiments disclosed herein are illustrative and are not limiting in all aspects. The embodiments described above may be omitted, replaced, or modified in various forms without departing from the scope and spirit of the appended claims.

The following configurations also fall within the technical scope of the present disclosure.

(1) An analysis device for analyzing results of inspection of an inspection object, wherein the inspection object includes a plurality of inspection target devices formed thereon and having respective electrodes on which needle marks are formed by being brought into contact with probes during an electrical inspection, wherein the analysis device includes: a display part configured to display an image, and an image generation part configured to generate an image to be displayed on the display part, and wherein the image generation part is configured to generate analysis images based on information pertaining to inspection results with respect to the needle marks, wherein the analysis image includes: a needle mark scatter plot image showing positions of the needle marks with respect to the electrodes in each of the plurality of inspection target devices in an overlapped manner; an inspection object map image which is an image showing a surface of the inspection object having the plurality of inspection target devices formed thereon, the inspection target device map image showing needle mark inspection results with respect to the plurality of inspection target devices at positions corresponding respectively to the plurality of inspection target devices; and a captured image of the electrodes, and wherein display contents of the needle mark scatter plot image, the inspection object map image, and the captured image are linked with each other.

According to (1) above, it is easy to visually recognize the tendency of contact positions and the accuracy of alignment between the electrodes and the probes between the inspection target devices, the tendency of needle mark state determination results in the plane of the inspection object, the portion in which the needle mark state is not good, and the like. In addition, it is possible to perform more detailed analysis of the needle marks, such as analysis of the approach directions of the probes.

(2) In the analysis device described in (1) above, some of the needle marks shown in the needle mark scatter plot image are specially displayed in the needle mark scatter plot image, some of the inspection target devices shown in the inspection object map image are specially displayed in the inspection object map image, and a content specially displayed in the needle mark scatter plot image, a content specially displayed in the inspection object map image, and a content of the captured image are linked to each other.

(3) In the analysis device described in (2) above, the needle marks shown in the needle mark scatter plot image and selected by a user are specially displayed in the needle mark scatter plot image, the inspection target devices having the electrodes on which the needle marks specially displayed in the needle mark scatter plot image are formed are specially displayed in the inspection object map image, and the captured image shows the electrodes on which the needle marks specially displayed in the needle mark scatter plot image are formed.

(4) In the analysis device described in (2) above, the inspection target devices shown in the inspection object map image and selected by a user are specially displayed in the inspection object map image, the needle marks formed on the electrodes of the inspection target devices specially displayed in the inspection object map image are specially displayed in the needle mark scatter plot image, and the captured image shows the electrodes of the inspection target devices specially displayed in the inspection object map image.

(5) In the analysis device described in any one of (1) to (4) above, the analysis image further includes a needle mark shape information display area showing information on shapes of the needle marks, and a display content of the needle mark shape information display area is linked with a display content of each of the needle mark scatter plot image, the inspection object map image, and the captured image.

According to (5) above, it is easy to perform a more detailed analysis of the needle marks.

(6) In the analysis device described in any one of (1) to (5) above, the analysis image further includes a character information display area showing at least one of information on the needle marks and information on the electrodes as character information, and a display content of the character information display area is linked with a display content of each of the needle mark scatter plot image, the inspection object map image, and the captured image.

According to (6) above, it is easy to perform a more detailed analysis of the needle marks.

(7) In the analysis device described in any one of (1) to (6) above, the inspection object map image shows the needle mark inspection results in three or more stages.

(8) In the analysis device described in any one of (1) to (7) above, the inspection object map image shows the needle mark inspection results with a color.

(9) An image generating method of generating an image used for analyzing results of inspection of an inspection object, wherein the inspection object includes a plurality of inspection target devices formed thereon and having respective electrodes on which needle marks are formed by being brought into contact with probes during electrical inspection, wherein the image generation method includes generating analysis images based on information pertaining to inspection results with respect to the needle marks, wherein the analysis image includes: a needle mark scatter plot image showing positions of the needle marks with respect to the electrodes in each of the plurality of inspection target devices in an overlapped manner; an inspection object map image which is an image showing a surface of the inspection object having the plurality of inspection target devices formed thereon, the inspection target device map image showing needle mark inspection results with respect to the plurality of inspection target devices at positions corresponding respectively to the plurality of inspection target devices; and a captured image of the electrodes, and wherein display contents of the needle mark scatter plot image, the inspection object map image, and the captured image are linked with each other

EXPLANATION OF REFERENCE NUMERALS

3: analysis device, 91: display part, 93a: image generation part, I1: needle mark scatter plot image, I2: wafer map image, I3: captured image, IN3: needle mark, IP3: electrode pad, U: user interface image, W: wafer

What is claimed is:

1. An analysis device for analyzing results of inspection of an inspection object, comprises:
   a display part configured to display an image; and
   an image generation part configured to generate an image to be displayed on the display part, and
   wherein the inspection object includes a plurality of inspection target devices formed thereon, the inspection target devices having respective electrodes on which needle marks are formed by being brought into contact with probes during an electrical inspection,
   wherein the image generation part is configured to generate an analysis image based on information pertaining to inspection results with respect to the needle marks, wherein the analysis image comprises:
   a needle mark scatter plot image showing positions of the needle marks with respect to the electrodes in each of the plurality of inspection target devices in an overlapped manner;
   an inspection object map image which is an image showing a surface of the inspection object having the plurality of inspection target devices formed thereon, the inspection target device map image showing needle mark inspection results with respect to the plurality of inspection target devices at positions corresponding respectively to the plurality of inspection target devices; and
   a captured image of the electrodes, and
   wherein display contents of the needle mark scatter plot image, the inspection object map image, and the captured image are linked with each other.

2. The analysis device of claim 1, wherein the analysis image further includes a needle mark shape information display area showing information on shapes of the needle marks, and
   a display content of the needle mark shape information display area is linked with a display content of each of the needle mark scatter plot image, the inspection object map image, and the captured image.

3. The analysis device of claim 1, wherein the analysis image further includes a character information display area showing at least one of the information on the needle marks and the information on the electrodes as character information, and
   a display content of the character information display area is linked with a display content of each of the needle mark scatter plot image, the inspection object map image, and the captured image.

4. The analysis device of claim 1, wherein the inspection object map image shows the needle mark inspection results in three or more stages.

5. The analysis device of claim 1, wherein the inspection object map image shows the needle mark inspection results with a color.

6. The analysis device of claim 1, wherein some of the needle marks shown in the needle mark scatter plot image are specially displayed in the needle mark scatter plot image,
   some of the plurality of inspection target devices shown in the inspection object map image are specially displayed in the inspection object map image, and
   a content specially displayed in the needle mark scatter plot image, a content specially displayed in the inspection object map image, and a content of the captured image are linked to each other.

7. The analysis device of claim 6, wherein the needle marks shown in the needle mark scatter plot image and selected by a user are specially displayed in the needle mark scatter plot image,
   the plurality of inspection target devices having the electrodes on which the needle marks specially displayed in the needle mark scatter plot image are formed are specially displayed in the inspection object map image, and
   the captured image shows the electrodes on which the needle marks specially displayed in the needle mark scatter plot image are formed.

8. The analysis device of claim 6, wherein the plurality of inspection target devices shown in the inspection object map image and selected by a user are specially displayed in the inspection object map image,
   the needle marks formed on the electrodes of the plurality of inspection target devices specially displayed in the inspection object map image are specially displayed in the needle mark scatter plot image, and
   the captured image shows the electrodes of the plurality of inspection target devices specially displayed in the inspection object map image.

9. An image generation method of generating an image used for analyzing results of inspection of an inspection object, the method comprises:
   generating an analysis image based on information pertaining to inspection results with respect to the needle marks,
   wherein the inspection object includes a plurality of inspection target devices formed thereon, the inspection target devices having respective electrodes on which needle marks are formed by being brought into contact with probes during an electrical inspection,
   wherein the analysis image includes:
   a needle mark scatter plot image showing positions of the needle marks with respect to the electrodes in each of the plurality of inspection target devices in an overlapped manner;
   an inspection object map image which is an image showing a surface of the inspection object having the plurality of inspection target devices formed thereon, the inspection target device map image showing needle mark inspection results with respect to the plurality of inspection target devices at positions corresponding respectively to the plurality of inspection target devices; and
   a captured image of the electrodes, and
   wherein display contents of the needle mark scatter plot image, the inspection object map image, and the captured image are linked with each other.

* * * * *